United States Patent [19]
Neuman

[11] Patent Number: 6,076,696
[45] Date of Patent: *Jun. 20, 2000

[54] CORRUGATED MAGNETIC COVER FOR ELECTRIC UTILITIES

[75] Inventor: Joseph A. Neuman, Portland, Oreg.

[73] Assignee: Temp Covers, Inc., Portland, Oreg.

[*] Notice: This patent is subject to a terminal disclaimer.

[21] Appl. No.: 09/177,845

[22] Filed: Oct. 22, 1998

Related U.S. Application Data

[63] Continuation-in-part of application No. 08/850,783, May 2, 1997, Pat. No. 5,829,622, which is a continuation-in-part of application No. 08/582,165, Jan. 2, 1996, abandoned.

[51] Int. Cl.[7] .................................................. A65D 51/00
[52] U.S. Cl. ............................. 220/230; 220/3.8; 206/818
[58] Field of Search ...................... 220/230, 3.8; 206/818

[56] References Cited

U.S. PATENT DOCUMENTS

| | | | |
|---|---|---|---|
| 2,727,650 | 12/1955 | Moynihan et al. | 206/818 |
| 2,855,578 | 10/1958 | Hirsch | 206/818 |
| 3,749,301 | 7/1973 | Peckar | 206/818 |
| 3,908,824 | 9/1975 | Takahara et al. | 206/818 |
| 3,961,721 | 6/1976 | Gordon et al. | 206/818 |
| 4,506,788 | 3/1985 | Dallas | 206/818 |
| 4,650,082 | 3/1987 | Paciorek | 215/230 |

*Primary Examiner*—Joseph M. Moy
*Attorney, Agent, or Firm*—Klarquist Sparkman Campbell Leigh & Whinston, LLP

[57] ABSTRACT

This invention comprises a removable reusable cover for an electric panel, said cover composed of light weight at least 3-ply corrugated material which is adhered to said electric panel by means of electrically non-conducting magnetic strips on rear edges of said cover to prevent exposure of the interior of said electric panel, with a front side of the cover providing a surface to contain printed warnings and the like.

16 Claims, 1 Drawing Sheet

DANGER
HAZARDOUS
VOLTAGE
DO NOT
REMOVE

AUTHORIZED
PERSONNEL
ONLY ically, 3-ply plastic corrugated material, with thin strips of magnetic material.

CORRUGATED MAGNETIC COVER FOR ELECTRIC UTILITIES

CROSS-REFERENCE TO PRIOR APPLICATION

This is a continuation-in-part of prior patent application Ser. No. 08/850,783, filed May 2, 1997 now U.S. Pat. No. 5,829,622, which was a continuation of prior patent application Ser. No. 08/582,165, filed Jan. 2, 1996,, now abandoned, both of which are incorporated herein by reference.

FIELD OF THE INVENTION

This invention relates to temporary electric utility covers in general and, more particularly, to covers having magnetic supporting means thereon for use as temporary covers of electrical fuse and circuit breaker panels and the like.

BACKGROUND AND SUMMARY OF THE INVENTION

During the construction or repair of an electrical panel or junction box and the like it is necessary for the electrician to remove the cover or door to the unit for extended periods of time. A temporary cover is very useful and necessary for safety when the unit needs to be left unattended. Often an electrician will leave panels exposed or may resort to applying a piece of cardboard or similar material with tape to serve this purpose. Usually, this type of temporary, makeshift cover does not convey the potential safety hazard and may not adhere adequately to the unit for extended periods of time. This approach would not meet federal safety standards.

Temporary protective covers for switches and outlets have been disclosed (U.S. Pat. No. Des. 307,538; U.S. Pat. No. Des. 345,142; U.S. Pat. No. 4,907,711; and U.S. Pat. No. 5,003,128). These covers do not use magnetic adhering means nor are they practically adaptable for large electrical panels. On the other hand, signs with magnetic adhering means have been disclosed (U.S. Pat. Nos. 2,957,261 and 3,372,503). These magnetic signs require a large number of small magnets or magnetic strips that occur at no greater intervals than 3 inches throughout the area of the sign. A large number of small magnets offer the disadvantages of high cost and complexity of manufacturing compared to magnetic strips. On the other hand, the use of numerous magnetic strips places said strips within the central area of the sign. In the case of the electrical covers, magnetic strips in the central area of the cover would not be useful because there would be no surface for adherence. In addition, placing electrically conducting magnetic strips in proximity to electrical parts is unwanted and unsafe. Thus, with electrical panel covers the magnets must be confined to the edges of the cover, still provide sufficient force for adherence, and, for safety, must not be electrically conducting.

The difficulties in creating a cover with magnetic adhering means for an electrical panel are that the cover has to be strong and durable and the magnets, being functionally restricted to the edges of the cover, have to provide sufficient magnetic force to prevent the sign from slipping or from being readily dislodged. Thus, the relationship between the weight of the cover and the adhering force of the magnets must be such that the cover will be held firmly in place. Furthermore, for safety reasons, the magnetic adhering means must be electrically non-conducting. Since critical features of the cover are that it have some rigidity in three dimensions and resist penetration with reasonable use, it is essential that the cover be constructed of sufficiently strong durable materials. The mass and density of standard materials disclosed in the prior art for these signs require an extensive amount of magnets. Construction of electric panel covers similar to that described for signs would make the covers expensive, heavy, and inconvenient to transport or store. Also, present industrial safety standards require temporary electrical panel covers to be composed of at least two layers, unlike signs disclosed in the prior art which are only one layer.

OBJECTS OF THE INVENTION

It is a particular objective of the present invention to so design a magnetic cover for electric panels that is semi-rigid, durable, corrugated (at least 3-ply), and lightweight wherein said cover is electrically non-conducting, protects personnel from exposure to electrical parts, and will remain in place with ordinary use and contact.

A further objective is to provide a temporary removable electrical panel cover to keep unauthorized people from exposed energized panel parts, to be used while working on an electrical panel when there is a need to leave the panel unattended.

It is another object of the present invention to provide a temporary electrical panel cover that is easy to store, transport, apply, and remove and which may be used any number of times.

SUMMARY OF THE INVENTION

With the above and further objectives and advantages in view, and with the provision of an efficient magnetic cover of simple and inexpensive construction, the invention comprises novel construction and adaptation and combination of parts hereinafter described and claimed. A preferred embodiment of this invention is a cover constructed of very lightweight corrugated plastic of at least 3-ply construction with thin strips of magnetic material on two opposite edges on the rear side of the cover, thus enabling the sign to be held by force of magnetism to a foundation surface composed of material which is attracted to the magnetic strips. The cover is rectangular in shape with the magnetic strips being applied adjacent to the longer edges of the rectangular cover. The length and width of the cover are made preferably slightly larger than the standard length and width of an electrical panel box.

BRIEF DESCRIPTION OF THE DRAWINGS

The details and advantages of this invention will become more apparent in the specifications, descriptions, and drawings, of which.

DETAILED DESCRIPTION OF THE PREFERRED EMBODIMENT

Figure 1:
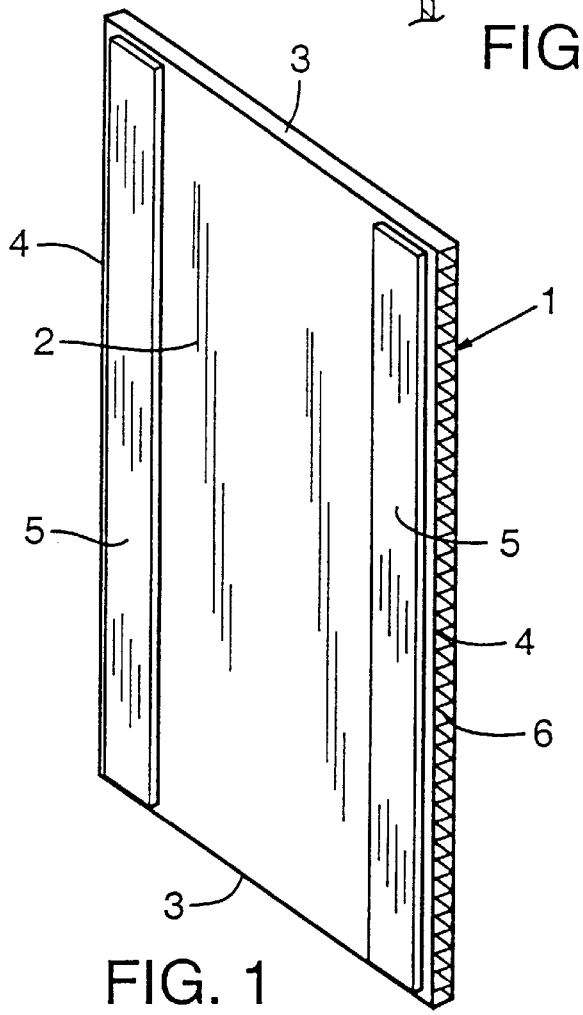
FIG. 1 is a perspective rear view of the temporary magnetic electrical cover.

FIG. 1 shows a perspective view of a preferred embodiment of the electric panel cover 1. The cover is rectangular in shape with the longer sides 4 ranging between 1.5 feet and 8.0 feet in length, preferably 4 feet, and the shorter sides 3 ranging between 1 foot and 4 feet, preferably 1 foot 2 9/16 inches or 1 foot 8 1/4 inches. The preferred dimensions accommodate standard electric panels. Elongate magnetic strips 5 are bonded on the rear side 2 of the cover and are disposed and extend adjacent, or along, the edges of the longer sides 4. The non-electrically conducting magnetic strips can be obtained from manufacturers of magnetic materials and are bonded to the rear edges of the cover with pressure sensitive adhesive on one side of the magnetic strip.

In one embodiment of the invention the magnetic strips range in width from 0.75 inches to 1.5 inches, preferably 1.25 inches and range in thickness from 0.030 inches to 0.093 inches, preferably 0.06 inches. The cover 1 is composed of at least 3-ply corrugated electrically non-conducting material such as plastic or cardboard which ranges in thickness from 0.079 inches to 0.220 inches, preferably 0.196 inches. It will be recognized that more than 3-ply material may be acceptable for this purpose also, so long as its weight is not too great to be supported by the magnetic strips. The thickness of each ply, 2, 6, and 7, ranges from 0.01 inches to 0.02 inches, preferably 0.018 inches. The number of corrugations 6 range from 4 per inch to 6 per inch, preferably 5 per inch. This type of multiple-ply plastic can be obtained from manufacturers of plastic materials.

It also has been discovered that the cover 1 in a second embodiment may be composed of multiple-ply corrugated electrical non-conducting material, such as plastic or cardboard, which ranges in thickness up to 0.4 inches (10 mm+). The thickness of each ply, such as those noted at 2, 6, and 7, may be range up to 0.04 inches. The number of corrugation 6 may range up to 12 per inch also. This type of multiple-ply plastic can be obtained from manufacturers of plastic materials. In this embodiment the magnetic strips would range in width from 0.5 inches to 2.0 inches, and range in thickness from 0.03 inches to 0.25 inches. The magnetic strength is in a range of Bhmax (MGoe) of 0.50 to 1.70.

Although the second embodiment discussed immediately here above may be heavier, it also could provide added protection against invasive punctures or other hazards.

Figure 2:
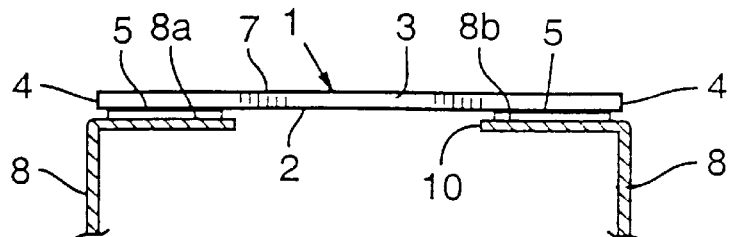
FIG. 2 is an end view of the magnetic cover mounted in place over an electrical panel box.

FIG. 2 shows an end view of the cover illustrating the front 7 and the rear 2 aspects of the cover with the magnetic strips 5 projecting from the rear side of the cover along the longer sides 4 of the cover.

Panel boxes on which the cover 1 would be used are well known in the industry and have been used for many years. Such a known panel box is shown at 8 in FIG. 4. A front portion of such a standard electrical panel box 8 also is shown in FIG. 2 having side edges, or edge portions, 8a, 8b with substantially aligned planar front surfaces facing outwardly toward panel cover 1. As is well known these opposed side edges of the electrical panel box are spaced apart to define a face opening 10 of a selected width. Such panel boxes have substantially similar top and bottom edges aligned in the plane of edges 8a, 8b to define a substantially rectangular face opening 10 for the panel box permitting access to the interior of the electrical panel box. Such a known panel box is described herein to define the environment in which the present invention is used.

The panel cover 1 has a width along shorter sides 3 which is greater than the width of the opening 10 between electrical box edge portions 8a, 8b, such that the panel is adapted to completely span and cover the opening 10 in the front of the electrical box. Further as is seen in FIG. 4 the panel is longer, or taller, than the electrical box for the same purpose.

As is illustrated in FIG. 2 the magnetic strips 5 are spaced apart a distance slightly greater than the opening width between edges 8a, 8b, such that they may engage edge portions 8a, 8b which are of a material which is attracted to a magnet. The magnetic strips will be held through magnetic attraction against side edges 8a, 8b.

Figure 4:
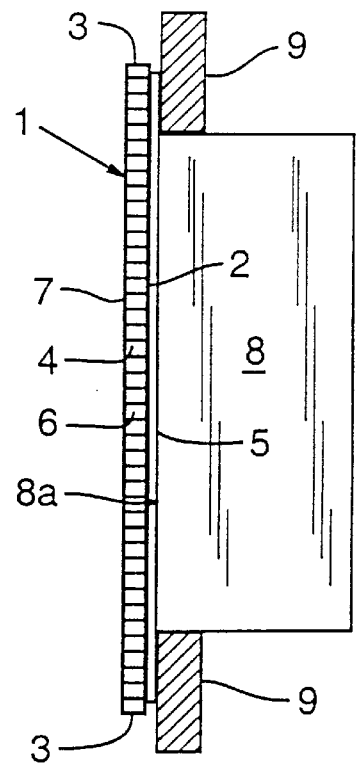
FIG. 4 is a side view of the magnetic cover in place over an electrical panel box.

As is illustrated in FIGS. 1, 2, and 4 the panel cover 1, and particularly its rear side 2, is substantially planar. The magnetic strips 5 also are substantially planar and extend substantially continuously adjacent the opposed longer sides 4. Each magnetic strip has a first end disposed closely adjacent one of the end edges 3 and extends along its respective side edge to terminate at the opposite end of the strip closely adjacent the opposite end edge 3. Since the magnetic strips extend substantially continuously along the length, or height, of the panel cover 1 a user may easily place the cover on an electrical panel box without undue effort to align the same vertically with selected portions of the panel box. Explaining further, it is a simple matter for a user to grasp the panel cover, hold it in the generally upright orientation illustrated in FIGS. 1 and 4, and place it over the opening in the electrical panel box with magnetic strips 5 engaging and magnetically attaching the panel cover to opposed edges 8a, 8b of the panel box.

Figure 3:
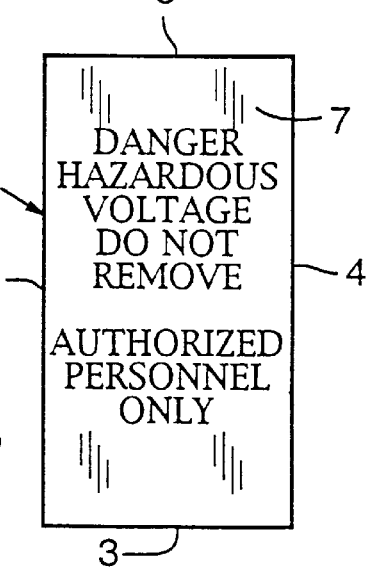
FIG. 3 is a front view of the magnetic cover.

FIG. 3 shows a frontal view of the cover and how the front portion 7 of the cover can be used as a sign to provide warning information.

FIG. 4 shows a side view, along a longer side 4, of the cover in place on an electrical panel box 8 with its supporting elements 9. The edges of the electrical panel box 8 and adjacent supporting elements 9 form a foundation surface composed of material which is attracted to the magnetic strips and upon which the cover adheres to prevent exposure of the interior of the electric panel box 8. The front 7, the rear 2 and the corrugations 6 of the cover show the 3-ply composition of the cover and their relationship to the magnetic strips 5 which cause the cover to adhere to the electric panel box 8 and supporting elements 9.

There has been shown and described in detail a preferred embodiment of this invention. However, it should be apparent to one skilled in the art that this invention may incorporate other embodiments in many different forms. The present disclosure serves as an exemplification of the principles of the invention and is not intended to limit the invention to the embodiment illustrated. The scope of the invention is described in the appended claims.

What is claimed is:

1. A removable reusable cover for an electric panel having a face opening defined in part by opposed edges which are composed of material which is attracted to a magnet and are spaced apart to define a selected opening width, the cover comprising a substantially planar corrugated sheet having at least 3 plies composed of electrically non-conducting material having opposed side edges spaced apart a distance greater than said selected opening width, said sheet having a front side and rear side and being composed of a non-conducting plastic material ranging in overall thickness from 0.079 to 0.220 inches and electrically non-conducting elongate magnetic strips on the rear side of said sheet adjacent the edges of said sheet positioned to engage the edges of the electric panel, wherein said cover may be held in place by said magnetic strips engaging the edges of such electric panel and extending across said opening in the panel to prevent exposure of the interior of the electric panel, with said front side of the sheet providing a surface to contain printed warnings and the like.

2. The cover of claim 1, wherein the thickness in each ply in the panel is in a range of from 0.01 to 0.02 inches.

3. The cover of claim 1, wherein the number of corrugation in an inner ply ranges from 4 to 6 per inch.

4. The cover of claim 1, wherein the panel is substantially rectangular and has opposed end edges extending between said side edges, and each of said magnetic strips is substantially continuous having a first end disposed closely adjacent one of said end edges and extending along its respective side edge to terminate at the opposite end of the strip closely adjacent the opposite end of the panel.

5. The cover of claim 1, wherein a magnetic strip has a width in a range of from 0.75 to 1.5 inches and a thickness in a range of from 0.030 to 0.093 inches, lies substantially flat against the rear side of the panel, and is adhered thereto.

6. A removable reusable cover for an electric panel having a face opening defined in part by opposed edges which are composed of material which is attracted to a magnet and are spaced apart to define a selected opening width, the cover comprising a substantially planar corrugated sheet having at least 3 plies composed of electrically non-conducting material having opposed side edges spaced apart a distance greater than said selected opening width, said sheet having a front side and rear side and being composed of a non-conducting plastic material with the thickness of each ply in the panel ranging from 0.01 to 0.02 inches, and electrically non-conducting elongate magnetic strips on the rear side of said sheet adjacent the edges of said sheet positioned to engage the edges of the electric panel, wherein said cover may be held in place by said magnetic strips engaging the edges of such electric panel and extending across said opening in the panel to prevent exposure of the interior of the electric panel, with said front side of the sheet providing a surface to contain printed warnings and the like.

7. The cover of claim 6, wherein the panel is substantially rectangular and has opposed end edges extending between said side edges, and each of said magnetic strips is substantially continuous having a first end disposed closely adjacent one of said edges and extending along its respective side edge to terminate at the opposite end of the strip closely adjacent the opposite end of the panel.

8. The cover of claim 6, wherein a magnetic strip has a width in a range of from 0.75 to 1.5 inches and a thickness in a range of from 0.030 to 0.093 inches, lies substantially flat against the rear side of the panel, and is adhered thereto.

9. A removable reusable cover for an electric panel having a face opening defined in part by opposed edges which are composed of material which is attracted to a magnet and are spaced apart to define a selected opening width, the cover comprising a substantially planar corrugated sheet having at least 3 plies composed of electrically non-conducting material having opposed side edges spaced apart a distance greater than said selected opening width, said sheet having a front side and rear side and being composed of a non-conducting plastic material, with the number of corrugations ranging from 4 to 6 per inch, and electrically non-conducting elongate magnetic strips on the rear side of said sheet adjacent the edges of said sheet positioned to engage the edges of the electric panel, wherein said cover may be held in place by said magnetic strips engaging the edges of such electric panel and extending across said opening in the panel to prevent exposure of the interior of the electric panel, with said front side of the sheet providing a surface to contain printed warnings and the like.

10. The cover of claim 9, wherein the panel is substantially rectangular and has opposed end edges extending between said side edges, and each of said magnetic strips is substantially continuous having a first end disposed closely adjacent one of said edges and extending along its respective side edge to terminate at the opposite end of the strip closely adjacent the opposite end of the panel.

11. The cover of claim 9, wherein a magnetic strip has a width in a range of from 0.75 to 1.5 inches and a thickness in a range of from 0.030 to 0.093 inches, lies substantially flat against the rear side of the panel, and is adhered thereto.

12. A removable reusable cover for an electric panel having a face opening defined in part by opposed edges which are composed of material which is attracted to a magnet and are spaced apart to define a selected opening width, the cover comprising a substantially planar corrugated sheet having at least 3 plies composed of electrically non-conducting conducting material having opposed side edges spaced apart a distance greater than said selected opening width, said sheet having a front side and rear side and being composed of a nonconducting plastic material ranging in overall thickness from 0.079 to 0.40 inches, and electrically non-conducting elongate magnetic strips on the rear side of said sheet adjacent the edges of said sheet positioned to engage the edges of the electric panel, wherein said cover may be held in place by said magnetic strips engaging the edges of such electric panel and extending across said opening in the panel to prevent exposure of the interior of the electric panel, with said front side of the sheet providing a surface to contain printed warnings and the like.

13. The cover of claim 12, wherein the thickness of each ply in the panel is in a range of from 0.01 to 0.04 inches.

14. The cover of claim 12, wherein the number of corrugations in an inner ply ranges from 2 to 12 per inch.

15. The cover of claim 12, wherein the panel is substantially rectangular and has opposed end edges extending between said side edges, and each of said magnetic strips is substantially continuous having a first end disposed closely adjacent one of said edges and extending along its respective side edge to terminate at the opposite end of the strip closely adjacent the opposite end of the panel.

16. The cover of claim 12, wherein a magnetic strip has a width in a range of from 0.5 to 2.0 inches and a thickness in a range of from 0.03 to 0.25 inches, lies substantially flat against the rear side of the panel, and is adhered thereto.

* * * * *

UNITED STATES PATENT AND TRADEMARK OFFICE
CERTIFICATE OF CORRECTION

PATENT NO. : 6,076,696
DATED : June 20, 2000
INVENTOR(S) : Joseph A. Neuman

It is certified that error appears in the above-identified patent and that said Letters Patent is hereby corrected as shown below:

Column 6, line 25, claim 12, "non-conducting conducting" should be
--non-conducting--.

Signed and Sealed this

Twenty-second Day of May, 2001

*Attest:*

NICHOLAS P. GODICI

*Attesting Officer*    Acting Director of the United States Patent and Trademark Office